United States Patent
Eagar et al.

(10) Patent No.: US 6,268,764 B1
(45) Date of Patent: Jul. 31, 2001

(54) BANDGAP VOLTAGE COMPARATOR USED AS A LOW VOLTAGE DETECTION CIRCUIT

(75) Inventors: Layton Eagar, Mesa; Willem Smit, Chandler, both of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/506,999

(22) Filed: Feb. 18, 2000

(51) Int. Cl.$^7$ .................................................. G05F 1/10
(52) U.S. Cl. ............................ 327/539; 327/77; 327/143
(58) Field of Search .................................... 323/313, 314, 323/315; 327/72, 77, 143, 538, 539, 543

Primary Examiner—Jeffrey Zweizig
(74) Attorney, Agent, or Firm—Baker Botts L.L.P.

(57) ABSTRACT

A bandgap voltage comparator requiring the summing of only two current sources is used to detect low voltage conditions for an logic on an integrated circuit that may be powered from a battery, fuel cell, solar cell and the like. Independent high and low voltage trip points may be programmed in the bandgap low voltage detection system. A power-on-reset delay may be used before asserting a voltage level ok status signal. Power may be disconnected from the bandgap voltage comparator low voltage detection system to conserve power, and power can be reapplied to quickly determine whether a desired voltage level is present.

21 Claims, 12 Drawing Sheets

BANDGAP VOLTAGE COMPARATOR USED AS A LOW VOLTAGE DETECTION CIRCUIT

FIELD OF THE INVENTION

This invention relates generally to semiconductor integrated circuits having low voltage detect and power-on reset, and, more particularly, to an integrated circuit using a bandgap voltage comparator having a low voltage threshold with long term voltage stability over a wide temperature range.

BACKGROUND OF THE RELATED TECHNOLOGY

Electronic devices, such as, cellular telephones, laptop computers, keyless and wireless entry devices, and other integrated circuit based products may be powered by, for example, a battery, a fuel cell, a solar cell, a generator and the like require a stable and accurate voltage reference for effective and predictable operation. It is important that an accurate and reliable way of initiating the start-up and shut-down of electronic circuits in these battery powered devices over all possible operating conditions be used. During start-up (power-up) a minimum voltage value must be reached before beginning operation thereof, and during operation whenever a voltage goes below a critical value the device must be stopped or inhibited from further operation. Typical applications that perform these functions are power-on reset (POR) and power-low reset (or brown-out reset (BOR)).

POR and BOR circuits typically use a precision voltage reference in combination with a voltage comparator circuit (s) for determining if the critical voltage value has been reached at which a device may properly operate. Typical voltage references used in integrated circuits have been buried Zener and bandgap references. The buried Zener is a very stable and accurate voltage reference, however, it typically operates at about 5 volts or more and draws several hundred microamperes for optimum operation. The newer battery powered electronic systems may run at a battery voltage of 2 volts or less, thus, the buried Zener technique is not suitable as a voltage reference which must run from such a low voltage and also have low power consumption. For such applications a "bandgap reference" may be utilized.

A bandgap voltage reference, typically 1.2 volts, may be generated with a semiconductor circuit. This reference may be hereinafter referred to as a bandgap voltage and may be compensated for variations over changes in temperature by combining a negative temperature coefficient voltage circuit with a positive temperature coefficient voltage circuit to produce a substantially zero temperature coefficient voltage circuit, i.e., the bandgap voltage value remains substantially the same over a wide temperature range. A precision bandgap voltage reference circuit is more fully described in U.S. Pat. No. 5,900,773 by David M. Susak, and is incorporated by reference herein for all purposes.

A bandgap reference in combination with a voltage comparator may be used to sense operating voltage levels for POR and BOR circuits. The bandgap reference and comparator may be combined into one circuit such as disclosed in U.S. Pat. No. 5,781,043 by Willam Slemmer, and entitled "DIRECT CURRENT SUM BANDGAP VOLTAGE COMPARATOR" (referred to hereinafter as "Slemmer"). The Slemmer patent discloses a direct current sum bandgap voltage comparator for detecting voltage changes in a power supply. Upon detecting a power supply voltage level below a certain value, the Slemmer comparator will cause a transfer switch to change the power source to a backup battery. The Slemmer bandgap voltage comparator uses four current sources summed together to produce a summing node voltage level, and generates a logic signal that indicates when the summing node voltage is greater than or equal to, or less than a predetermined value. The predetermined value corresponds to a desired power supply voltage switchover value.

The prior art voltage references and comparator circuits are too complex, draw too much current, require operating voltage levels higher than are available in the newer battery operated electronic systems, and suffer from temperature and voltage stability variations. Thus, a need exists to provide an improved voltage comparator having low operating current, a stable voltage reference over a wide range of operating temperatures, and simple and reliable implementation in an integrated circuit.

SUMMARY OF THE INVENTION

The invention overcomes the above-identified problems as well as other shortcomings and deficiencies of existing technologies by providing an improved bandgap voltage comparator which may be utilized with other circuits in integrated circuit devices as a low voltage detection circuit. The integrated circuit devices may be, for example but not limited to, the complementary metal oxide semiconductor (CMOS) PIC Microcontroller family manufactured by Microchip Technology Inc., more fully described at http://www.microchip.com/ and incorporated by reference herein for all purposes. The present invention may operate at one volt and above, and only draw a relatively small amount of current in operation. Implementation of the embodiments of the invention in an integrated circuit is efficient and only requires a small area of the die. Accurate tip points are preferably plus or minus 50 millivolts over all process comers and industrial temperature ranges. In embodiments of the invention, power up and power down trip points can be set independently, i.e., programmable hysteresis. These trip points are insensitive to VDD rise and fall times. Embodiments of the invention may have immediate POR or BOR generation on a low voltage condition, i.e., falling VDD. A hold-off time, for example but not limitation, may be 1–10 microseconds (programmable) for a POR signal after detection of a rising trip point. The embodiments of the invention may draw no current when placed in a standby mode (sleep mode), and can evaluate voltage levels when taken out of the standby mode. A low voltage condition signal will be generated if a low voltage condition exists upon activation from the standby mode. The present invention is thus well suited for both power-on reset (POR) and power-low reset (brown-out reset BOR) modes. The predictable and efficient operation of this circuit will ensure reliable operation for all battery (2 volts or more) operated applications.

In accordance with the embodiments of the present invention, an improved bandgap voltage comparator circuit may be implemented on a semiconductor integrated circuit substrate using standard fabrication processes. Standard PNP transistors such as, for example but not limitation, lateral PNP (LPNP) transistors may be used in a circuit needing only two current mirrors to form a bandgap voltage comparator. Using only two current sources greatly simplifies the bandgap circuit and improves trip voltage stability with changes in temperature. The areas of the PNP transistors used for the second current mirror circuit may be from about four to forty eight times the area of the PNP transistors used for the first current mirror circuit, depending on the gain desired for the comparator circuit. An exemplary schematic diagram of the basic bandgap comparator of the present invention is illustrated in FIG. 4A and is described in more detail hereinbelow.

A bandgap comparator circuit, according to the embodiments of the invention, having an adjustable trip point is illustrated in the schematic diagram of FIG. 4 and is described in more detail hereinbelow. A graphical representation of an operational simulation of the embodiment of the bandgap comparator low voltage detection system of FIG. 2 is illustrated in FIG. 11. An output buffer circuit that may be used in combination with the bandgap comparator circuit of FIG. 4 is illustrated in FIG. 5. A power-on reset delay circuit that may be used with the bandgap comparator of FIG. 4 is illustrated in FIG. 6 and is described in more detail hereinbelow. An output latch with power down circuit that also may be used with the bandgap comparator circuit of FIG. 4 is illustrated in FIG. 7 and is described in more detail hereinbelow.

Bandgap voltage operation in integrated circuit devices is more fully described in "Analysis and Design of Analog Integrated Circuits," by Paul Gray and Robert Meyer, (1984, second edition), John Wiley & Sons, ISBN 0-471-897493-0, and is incorporated by reference herein for all purposes.

A feature of the present invention is operation at one volt and above by a bandgap voltage comparator.

Another feature is low current operation.

Another feature is that power-up and power-down trip points can be set independently.

Another feature is an immediate power-on reset (POR) signal generated upon detection of a low voltage supply condition.

Another feature is time delayed hold-off of a POR signal OK after detection of a rising voltage supply going above a desired voltage value (trip point).

Another feature is substantially no power being used when in a standby mode.

Another feature is evaluating voltage level when taken from a standby to an active mode and generating a POR signal if a low voltage condition exists.

An advantage of the present invention is that it may be implemented on an integrated circuit using standard semiconductor fabrication processes while only requiring a small area for fabrication thereon.

Another advantage is low current operation.

Another advantage is trip points are insensitive to voltage rise and fall times.

Another advantage is accurate trip points, preferably, plus or minus about 50 millivolts over all process corners and industrial temperature ranges.

The foregoing and other features and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
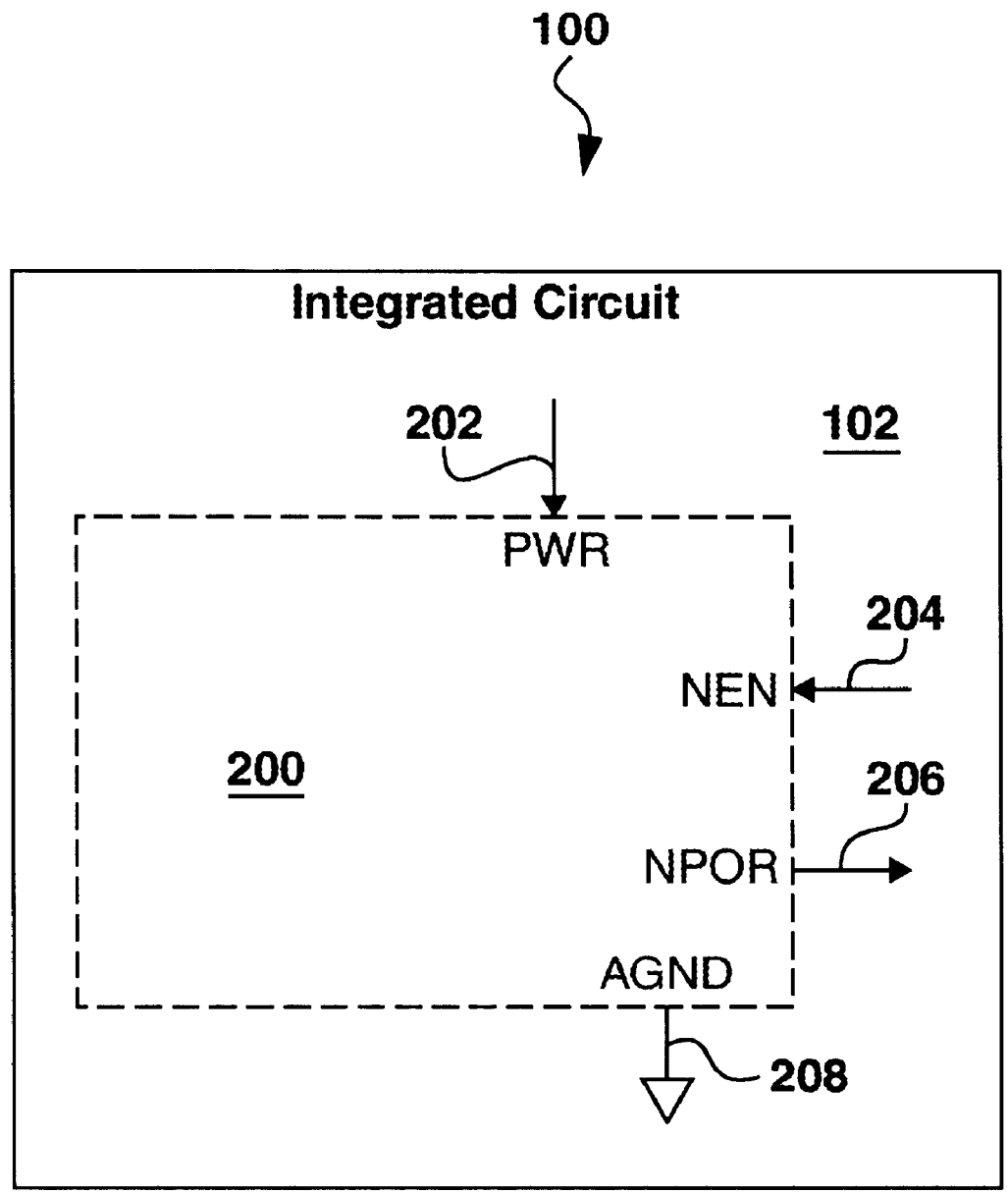
FIG. 1 is a schematic block diagram of an microcontroller integrated circuit with a bandgap comparator voltage detection system having a power-on-reset.

The embodiments of the present invention comprise a bandgap voltage comparator requiring only two current sources for stable voltage operation over a given operating temperature range. The embodiments of the present invention may also comprise a power-on reset delay circuit, and an output latch with power down control. The present invention may be fabricated in an integrated circuit using standard transistor devices and may be utilized with all types of battery, fuel cell, solar cell, generator and the like powered integrated circuit logic such as for example but not limited to, microcontrollers, microprocessors, digital signal processors, memory devices, keyless and wireless entry devices, and any other digital logic circuit or system which can benefit from a reliable and accurate power-on reset (POR) and brown-out reset (BOR) logic for controlling the operation of the digital logic circuits over a desired range of operating voltage values. The present invention may be used to inhibit the operation of logic circuits when a supply voltage goes below a predetermined minimum value. The present invention may also be used to delay the start of operation of the digital logic circuits until a desired minimum supply voltage has been reached for a predetermined time. If, however, the supply voltage goes below the predetermined minimum value, then the present invention can immediately signal for a halt in the operation of the digital logic circuits so that incorrect or false operation thereof cannot occur.

Referring now to the drawings, the details of preferred embodiments of the invention are schematically illustrated. Elements in the drawings that are the same will be represented by the same numbers and/or letters, and similar elements will be represented by the same numbers and/or letters with a different lower case letter suffix.

Referring to FIG. 1, a schematic block diagram of an integrated circuit having electronic circuits thereon is illustrated. The integrated circuit, generally indicated by the numeral 100, comprises a bandgap voltage comparator low voltage detection system 200 having outputs for a power-on reset (POR) and/or brownout-on reset (BOR), according to embodiments of the present invention, and electronic circuit(s) 102 such as, for example but not limited to, a microcontroller such as the PIC series microcontrollers by Microchip Technology Inc., more fully described at http://www.microchip.com/ and incorporated by reference herein for all purposes. It is contemplated and within the scope of the present invention that any electronic device, such as for example, cellular telephones, laptop computers, keyless and wireless entry devices, and other integrated circuit based products which may be powered by, for example, a battery, a fuel cell, a solar cell, a generator and the like that require a stable and accurate voltage reference for effective and predictable operation.

According to embodiments of the present invention, the bandgap voltage comparator low voltage detection system 200 may be programmably powered down to conserve power in the integrated circuit 100. Power is monitored between node 202 (PWR) and ground node 208 (AGND). A bandgap enable/disable input node 204 (NEN) may be used to enable and disable the bandgap comparator low voltage detection system 200, and a bandgap output signal node 206 (NPOR) may be used to inhibit operation of the logic circuits of the integrated circuit 100. A low-voltage detect control register (not illustrated) may also be incorporated into the digital logic circuits for programmable control of a trip voltage value and status flags indicating operation of the bandgap comparator low voltage detection system 200. This low-voltage detect control register preferably will be capable of operating at a low voltage and may further be implemented with non-volatile memory for data storage. Fusible links or other electrically programmable read only memory (EPROM) or electrically erasable EPROM (EEPROM) may be utilized for storing programming information and/or event occurrences.

Figure 2:
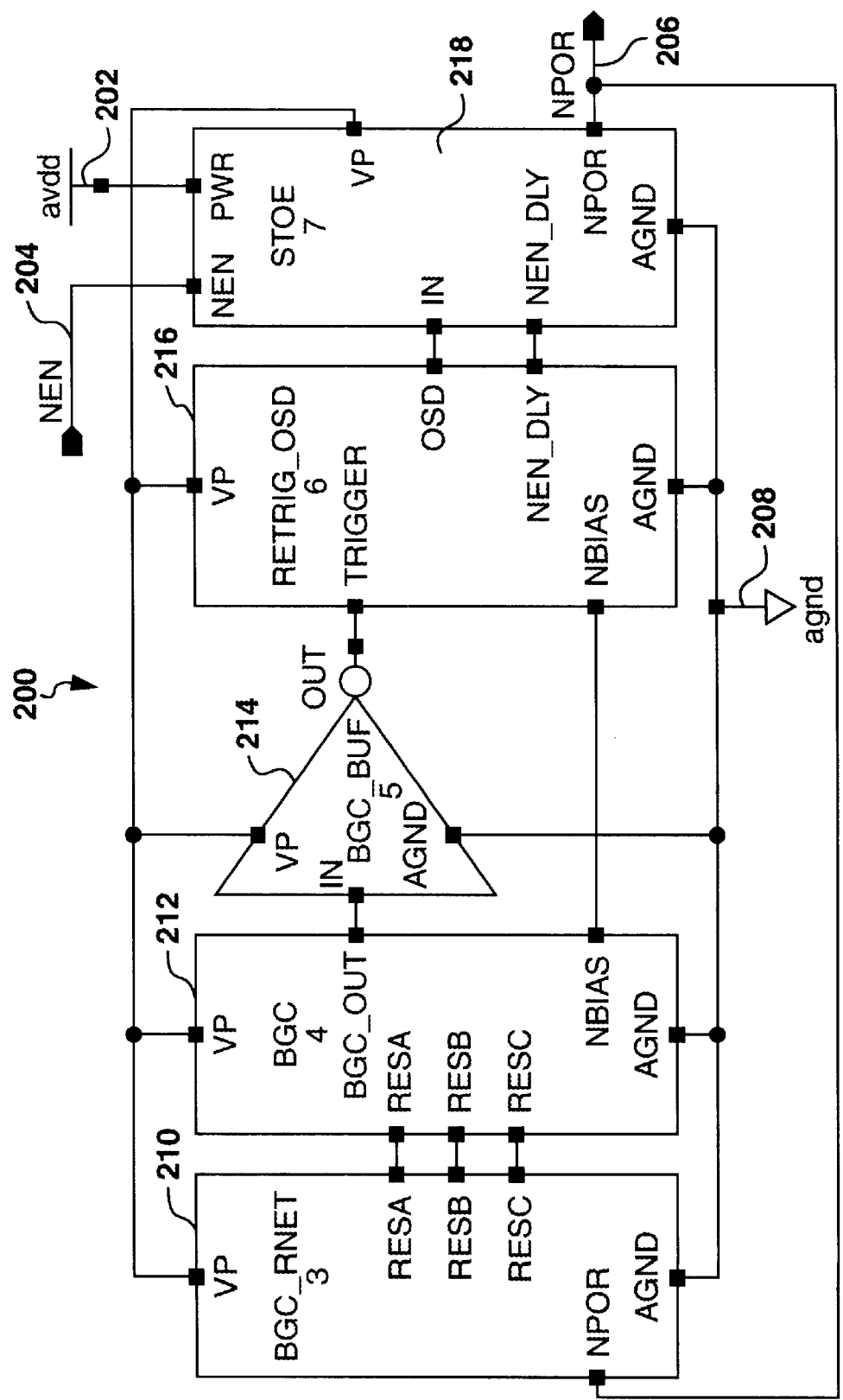
FIG. 2 is a schematic block diagram of a bandgap comparator low voltage detection system, according to an embodiment of the invention.

Referring to FIG. 2, a schematic block diagram of a bandgap comparator low voltage detection system 200 is illustrated. An embodiment of the bandgap comparator low voltage detection system 200 comprises a resistor programming block 210 (BGC_RNET), a bandgap comparator 212 (BGC), a buffer 214 (BGC_BUF), a retriggerable monostable one-shot delay 216 (REDTRIG_OSD), and a Schmitt trigger with output enable 218 (STOE).

Figure 3:
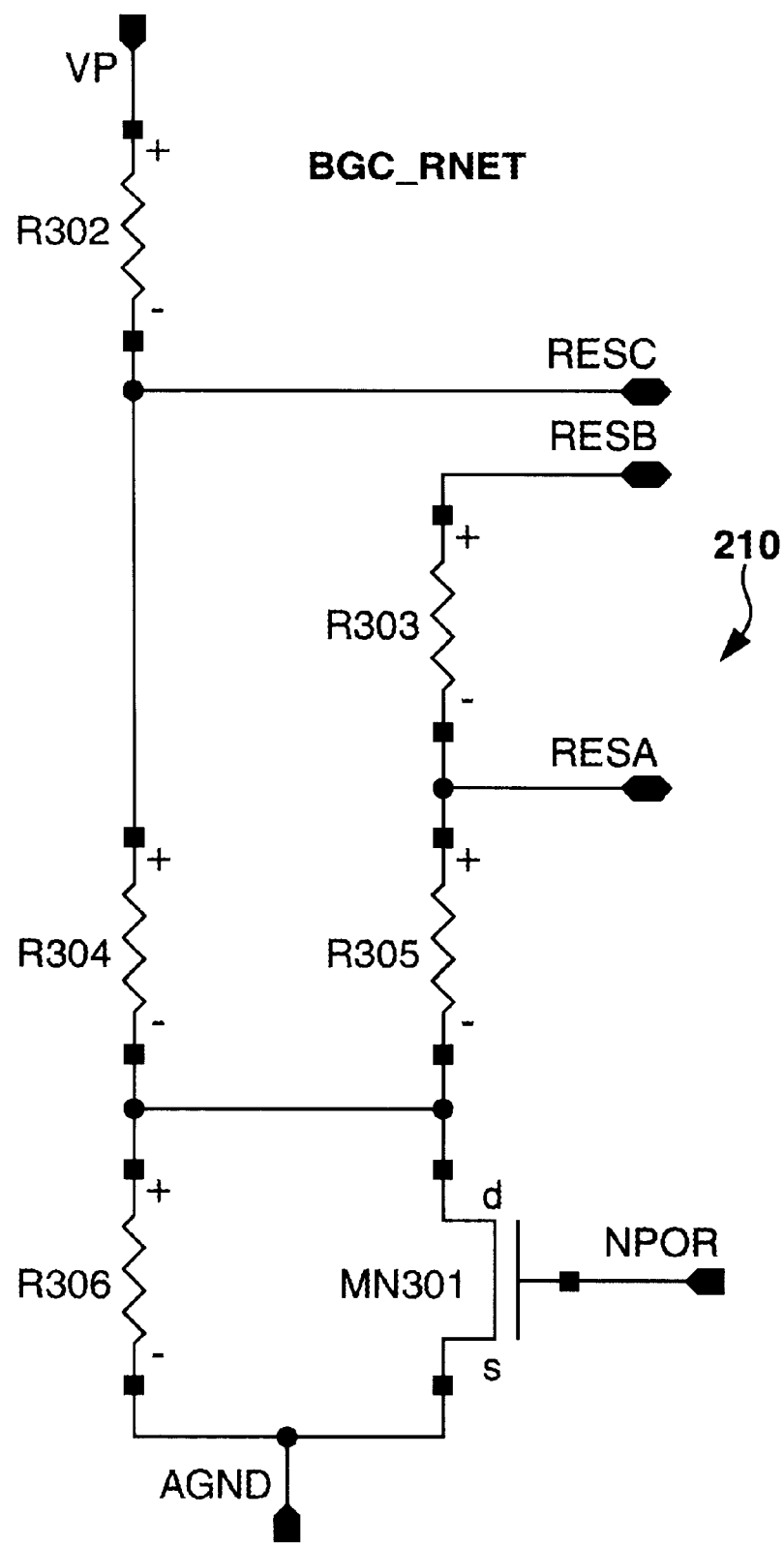
FIG. 3 is a schematic circuit diagram of the resistor programming block of FIG. 2.

Referring to FIG. 3, a schematic diagram of the resistor programming block of FIG. 2 is illustrated. The resistor programming block 210 is used to set different trip voltages for the bandgap comparator 212. By adjusting the of resistance ratios of a combination of resistors R303–R306, both the voltage trip point and the temperature compensation may be adjusted for the bandgap comparator 212, more fully described hereinbelow.

Figure 4:
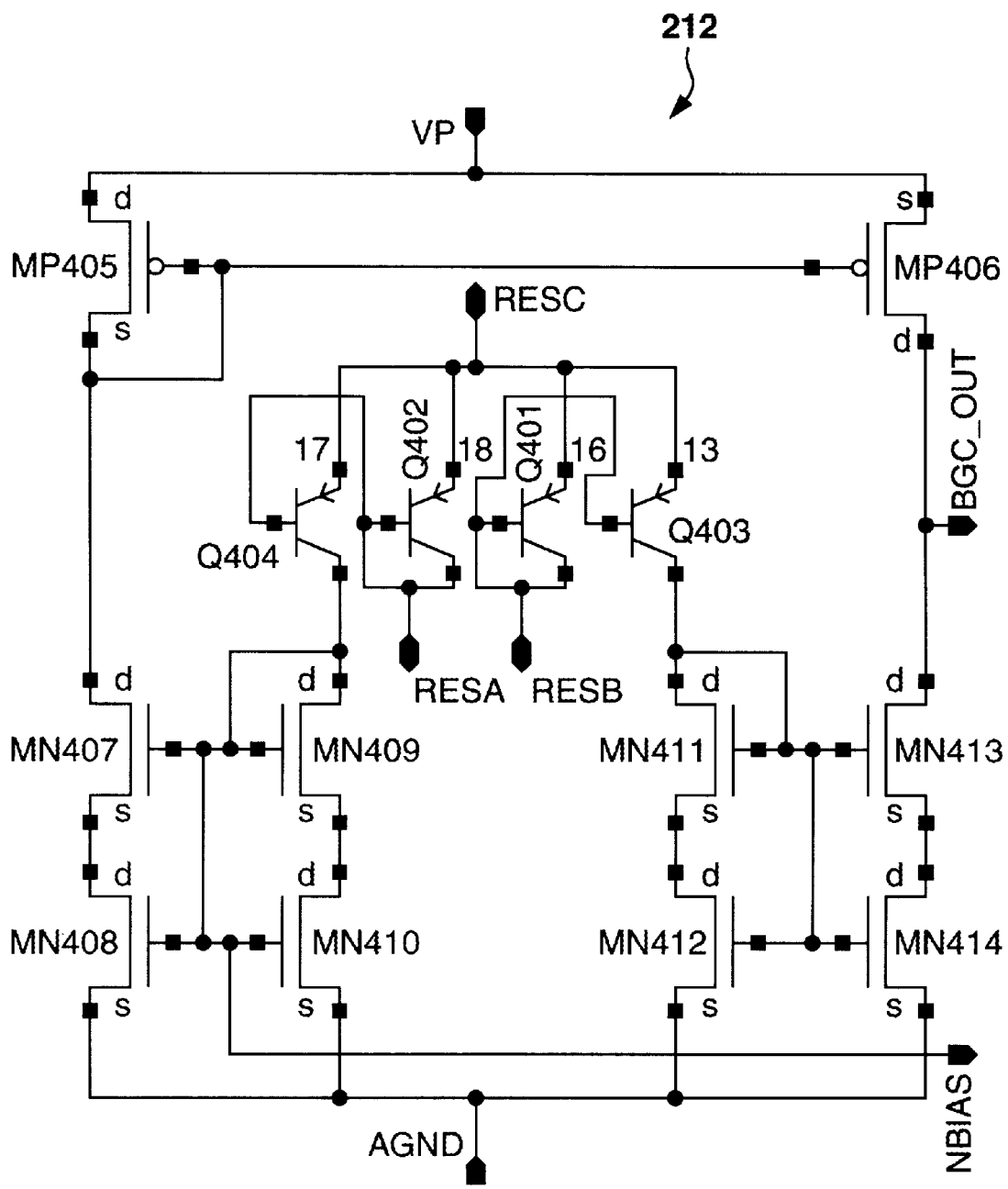
FIG. 4 is a schematic circuit diagram of the bandgap comparator block of FIG. 2.

Referring to FIG. 4, a schematic diagram of the bandgap comparator block of FIG. 2 is illustrated. The bandgap comparator 212 trip voltage is adjusted by the resistor programming block 210 of FIG. 3. The bandgap comparator 212 comprises bipolar transistors from whose characteristics a bandgap voltage is derived. Transistors Q401–Q404 may be for example but not limitation lateral PNP (LPNP) transistors. Transistors MN407–MN414 are N-channel metal oxide semiconductor (NMOS) transistors, and transistors MP405 and MP406 are P-channel metal oxide semiconductor (PMOS) transistors. Transistors Q404 and Q402 form a first current mirror, and transistors Q401 and Q403 form a second current mirror. Transistors MP405 and MP406 are current mirrors to form pull up currents to complement the pull down currents from MN413 and MN414. Transistors MN411 and MN412 sense the current through Q403 which is the same as the current through Q401 (current mirror). Transistors MN409 and MN410 sense the current through Q404 which is the same as the current through Q402 (current mirror). In combination, transistors MP406, MN413 and MN414, and MP405, MN407 and MN408 form a bistable circuit wherein an output BGC_OUT has either a high or a low logic state depending on whether the current through Q401 (Q403) is greater than or less than the current through Q402 (Q404). It is contemplated and within the scope of the present invention that NPN transistors may also be used in the bandgap comparator circuit described herein.

Figure 5:
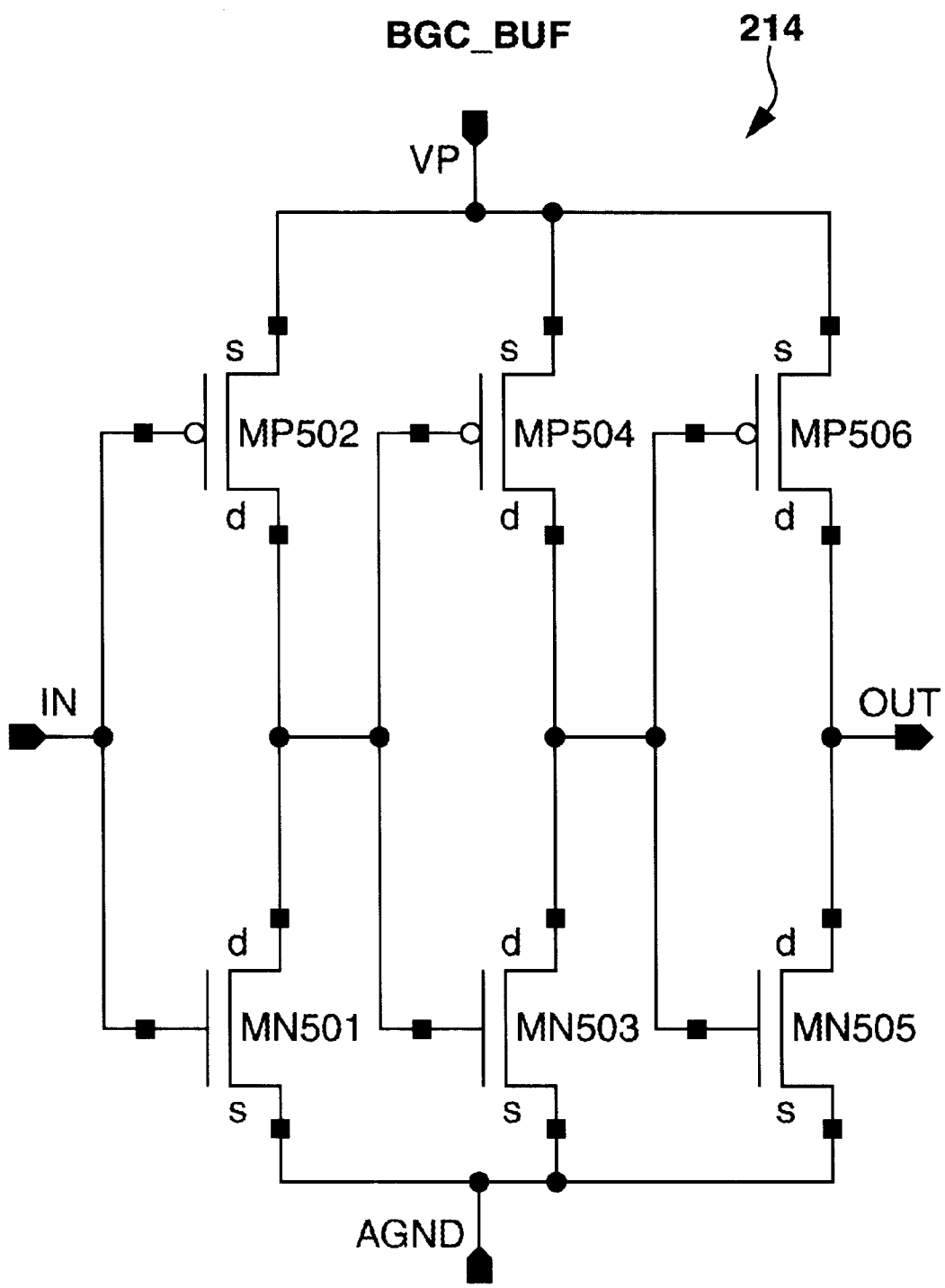
FIG. 5 is a schematic circuit diagram of the buffer block of FIG. 2.

Referring to FIG. 5, a schematic circuit diagram of the buffer block of FIG. 2 is illustrated. The buffer 214 is an inverting buffer whose output is used to trigger the retriggerable monostable one-shot delay 216. NMOS transistor MN501 and PMOS transistor MP502 form a first inverter, NMOS transistor MN503 and PMOS transistor MP504 form a second inverter, and NMOS transistor MN505 and PMOS transistor MP506 form a third inverter.

Figure 6:
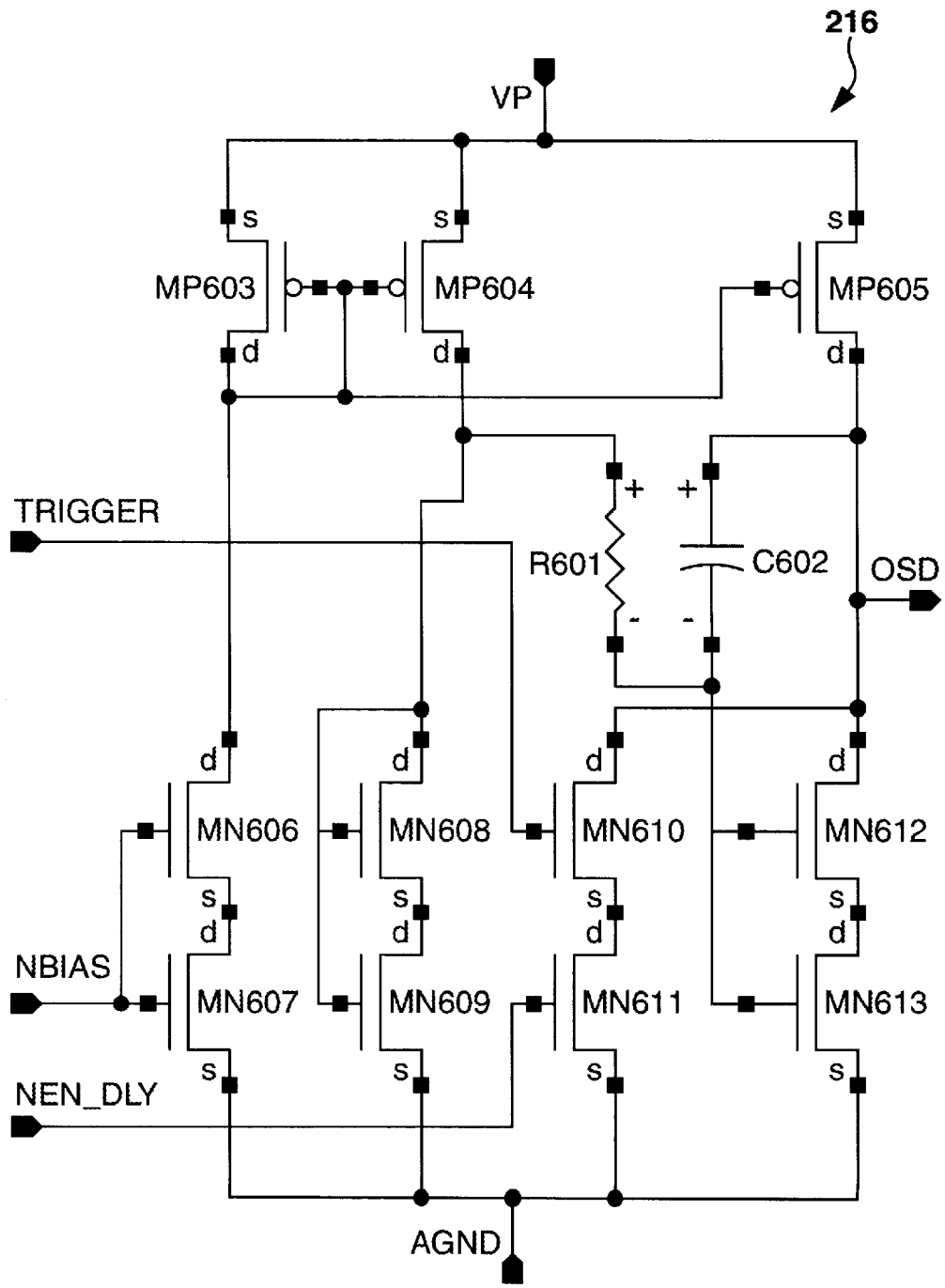
FIG. 6 is a schematic circuit diagram of the retriggerable monostable one-shot delay of FIG. 2.

Referring to FIG. 6, a schematic circuit diagram of the retriggerable monostable one-shot delay of FIG. 2 is illustrated. The retriggerable monostable one-shot delay 216 forms a power-on reset delay circuit which is utilized to delay the output signal from the buffer 214. Capacitor C602 and resistor R601 determine the turn-on delay time constant once a high enough voltage is detected by the bandgap comparator 212. The retriggerable monostable one-shot delay 216 may help reduce the effects of noise by requiring a time delay before the NPOR 206 is activated.

Figure 7:
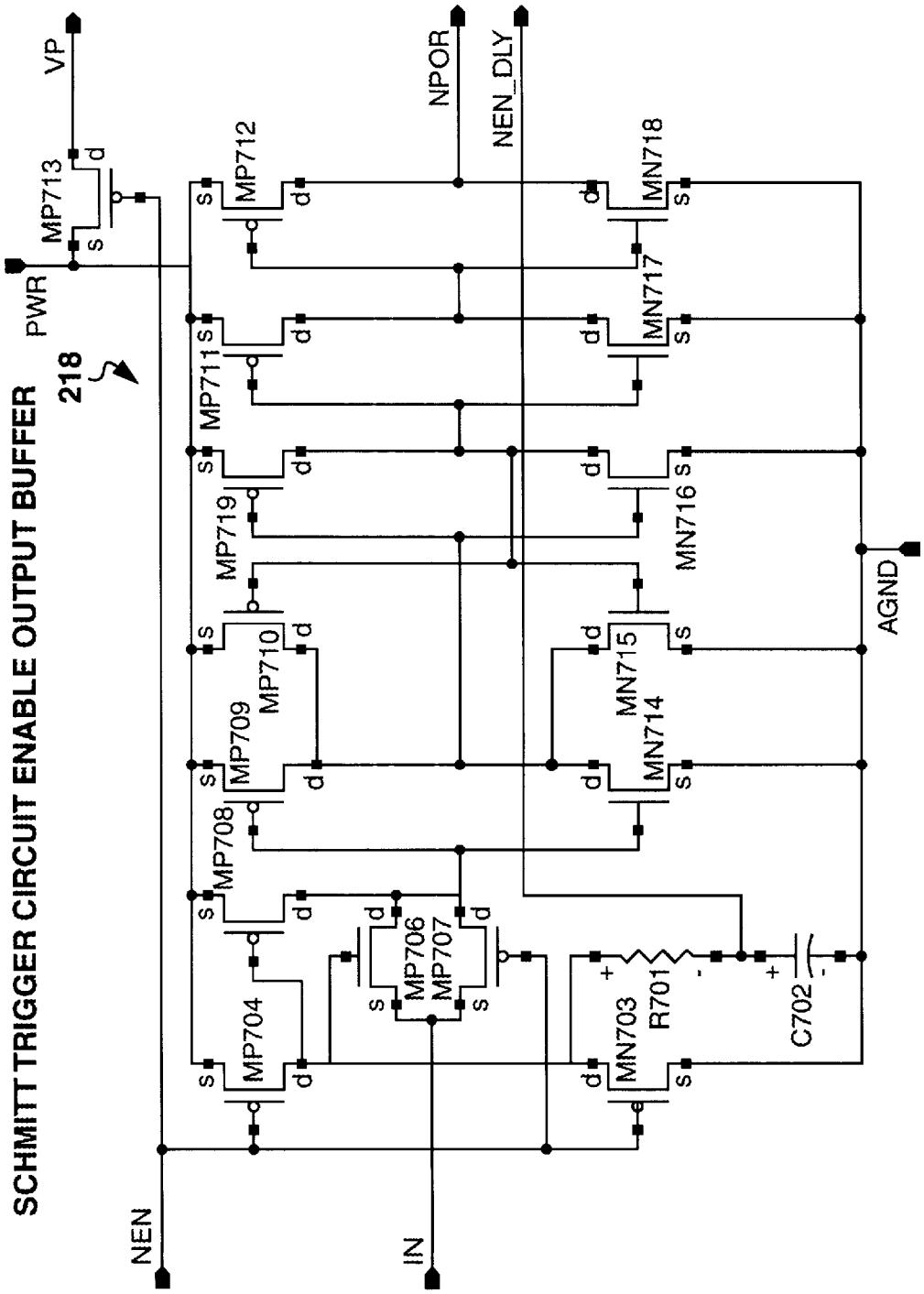
FIG. 7 is a schematic circuit diagram of the Schmitt trigger with output enable of FIG. 2.

Referring to FIG. 7, a schematic circuit diagram of the Schmitt trigger with latch and output enable (STOE) 218 of FIG. 2 is illustrated. The STOE 218 is adapted to shut off the entire circuit of the bandgap comparator low voltage detection system 200 so that substantially no power is consumed, while latching the output of the retriggerable monostable one-shot delay 216.

Figure 4A:
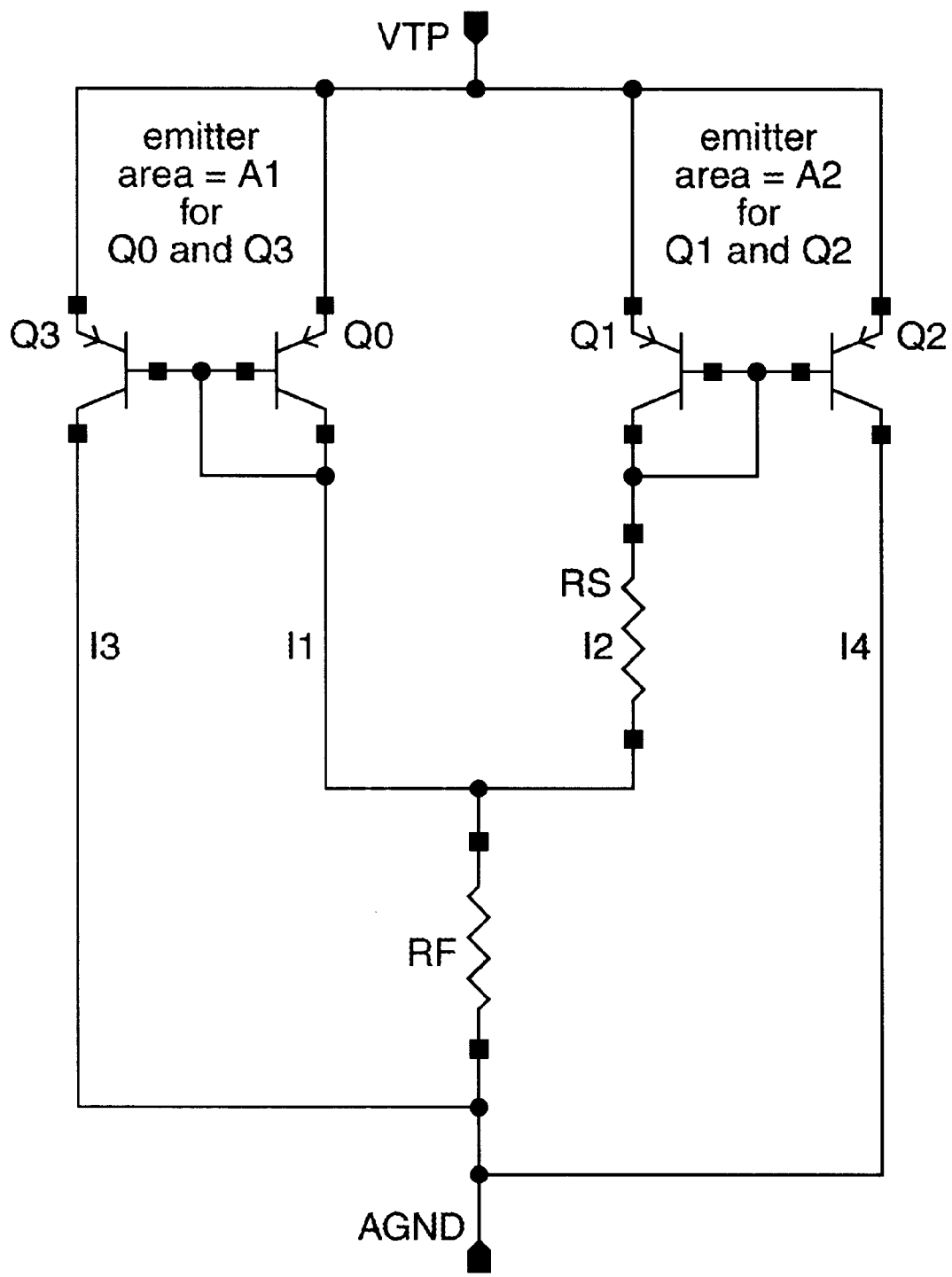
FIG. 4A is a schematic diagram of a basic bandgap comparator circuit, according to embodiments of the present invention.

Referring now to FIG. 4A, a schematic diagram of the basic bandgap comparator circuit, according to the embodiments of the present invention, is illustrated. Transistors Q3 and Q0 form a first current source, and transistors Q1 and Q2 form a second current source. Preferably, the transistors Q0–Q4 may be lateral PNP (LPNP) transistors. NPN transistors may also be used by reversing the voltage polarity referenced herein. Preferably, the areas of each of the transistors Q1 and Q2 may be from about four to forty-eight times the areas of each of the transistors Q0 and Q3. The greater the ratio of the area, the greater the gain of the comparator circuit. The basic operation of the bandgap comparator illustrated in FIG. 4A may be better understood by referring to the equations and descriptions thereof hereinbelow.

(1) Let $T_k$=degrees absolute temperature Kelvin (hereinafter "K")

(2) $V_{tk}=(k/q) \times T_k$, thermal voltage, $k/q=86.7\ \mu V/(\deg.\ K)$ (3) $I_s = C \times T_k{}^N \times EXP\hat{}-(V_{go}/V_{tk})$, reverse saturation current of a PN junction.

Equation 3 is empirically derived from data for a given semiconductor process. In particular, the constants C, N and $V_{go}$ are process dependant.

(4) $V_d(T_k) = V_{tk} \times \ln(I_d/I_s)$, which is the diode equation for a PN junction in forward biased operation.

(5) Solving for $V_{TP}$ with Q0 and RF in terms of I1 and I2 is as follows:

$$V_{TP} = (I1+I2) \times RF + V_{tk} \times \ln(I1/(A1 \times I_s))$$

(6) Solving for $V_{TP}$ with Q1, RF, RS, I1 and I2 is as follows:

$$V_{TP} = (I1+I2) \times RF + I2 \times RS + V_{tk} \times \ln(I2/(A2 \times I_s))$$

(7) Subtracting equation 5 from equation 6 is as follows:

$$I2 \times RS + V_{tk} \times \{\ln(I2/(I_s \times A2)) - \ln(I1/(I_s \times A1))\} = 0$$

$$I2 = V_{tk} \times \ln\{(I1 \times A2)/(I2 \times A1)\}/RS$$

The comparison point is the voltage of $V_{TP}$ when I1=I2:

(8) $I = V_{tk} \times \ln(A2/A1)/RS$ (9) Substitute equation 8 into equation 5 is as follows:

$$V_{TP} = 2 \times RF \times V_{tk} \times \ln(A2/A1)/RS + V_{tk} \times \ln\{(V_{tk} \times \ln(A2/A1))/(RS \times I_s)\}$$

(10) Substitute equation 3 into equation 9 is as follows:

$$V_{TP} = V_{tk} \times \{2 \times RF/RS \times \ln(A2/A1) + \ln(V_{tk} \times \ln(A2/A1)/RS) - \ln(I_s)\}.$$

(a) Expanding the "$\ln(I_s)$" term:

$$V_{TP} = V_{tk} \times \{2 \times RF/RS \times \ln(A2/A1) + \ln(V_{tk} \times \ln(A2/A1)/RS) - \ln(C \times Tk^n \times EXP^{-(V_{go}/V_{tk})})\}$$

(b) Simplifying:

$$V_{TP} = V_{tk} \times \{2 \times RF/RS \times \ln(A2/A1) + \ln(V_{tk} \times \ln(A2/A1)/RS) - \ln(C \times T_k^N) + V_{go}/V_{tk}\}$$

(c) Simplifying further:

$$V_{TP} = V_{tk} \times \{2 \times RF/RS \times \ln(A2/A1) + \ln(V_{tk} \times \ln(A2/A1)/RS) - \ln(C \times T_k^N)\} + V_{go}$$

(d) Substituting equation 2 into equation 10 as follows:

$$V_{TP}(T_{tk}) = (k/q \times T_k) \times \{2 \times RF/RS \times \ln(A2/A1) + \ln((k/q \times T_k) \times \ln(A2/A1)/RS) - \ln(C \times T_k^N)\} + V_{go}$$

Equation 10d predicts the voltage trip point, $V_{TP}$, of the bandgap comparator of FIG. 4A as a function of temperature, $T_k$. Thus, when I2 is greater than I1, the voltage detected by the bandgap comparator is greater than $V_{TP}$, and when I2 is less than I1, the voltage detected is less than the $V_{TP}$. Since Q0 and Q3 form the first current mirror, I1=I3, and Q1 and Q2 form the second current mirror, I2=I4, it is relatively easy to measure the difference between I3 and I4 such that a digital logic output may be derived therefrom for controlling a power-on-reset signal.

The circuit illustrated in FIG. 4A may preferably operate from about 0.6 volts to above 5 volts. The range is only limited by the PN junction voltage such as for example, silicon bipolar transistors have approximately a PN junction voltage of about 0.6 volts. Germanium, hot-carrier, and Schottky bipolar transistors may have a lower PN junction voltage and may be effectively utilized for the present invention.

For a particular semiconductor process, in order to minimize the $V_{TP}$ variation with temperature, the first derivative of equation 10 with respect to $T_k$ needs to be taken. The positive temperature resistor ratio and emitter ratio A2/A1 also need to be factored into the design considerations as follows:

(11)

$$dV_{TP}(T_k)/dT_k = (k/q) \times \{2 \times RF/RS \times \ln(A2/A1) + 1 - \ln((RS \times C \times T_k^{(N-1)}/(k/q \times \ln(A2/A1))) - N\}$$

Setting $dV_{TP}(T_k)/dT_k = 0$ (equation 11) and solving for RF/RS at the midpoint of the desired operating temperature range will preferably give the best temperature performance over the desired operating temperature range.

(12)

$$RF/RS(T_k) = \{\ln(RS \times C \times T_k^{(N-1)}) - \ln(k/q \times \ln(A2/A1) + N - 1\}/\{2 \times \ln(A2/A1)\}$$

It can be shown that the RF/RS resistor ratio is dependant on the process dependant $I_s$ function, the emitter area ratio A2/A1, and the absolute temperature in Kelvin, $T_k$. Preferably, for most typical applications A1=1 square unit and A2 may be an integer multiple of A1 in a range from about 4 to 48 depending on the gain that is required by the bandgap comparator. The greater the area ratio, A2/A1, the greater the gain, resulting in a higher sensitivity of the comparator. It should be noted that the $V_{TP}$ of the bandgap comparator is only a weak function of $T_k$ and is a primarily set by the bandgap voltage constant, $V_{go}$.

Referring to equation 10d, and re-arranging equation 11d into sub-functions of $T_k$ that represent positive and negative temperature functions as follows:

(13)

$$V_{TP}(T_k) = (k/q \times T_k) \times \{2 \times RF/RS \times \ln(A2/A1) - \ln((RS \times C \times Tk^{(N-1)})/(k/q \times \ln(A2/A1))\} + V_{go}$$

The "$2 \times RF/RS \times \ln(A2/A1)$" portion of equation 13 is the positive temperature function, and the "$\ln((RS \times C \times Tk^{(N-1)})/(k/q \times \ln(A2/A1))$" portion is the negative temperature function. The band gap voltage constant, $V_{go}$, has substantially a zero temperature coefficient, and may vary, for example, from about +/-2% of about 1.19 volts, depending on the semiconductor process used to fabricate the bandgap comparator.

In practical terms, $V_{TP}$ is $V_{go}$ plus or minus the temperature variation from the mid-point of the operating range. Preferably, a properly temperature compensated bandgap comparator will have the $V_{TP}$ vary less than +/-50 mV over the operating temperature range with the high point approximately at the mid-point of the operating temperature range. The resistor ratio RF/RS is directly dependant on the ln(A2/A1) transistor emitter area ratio, thus the greater the value of ln(A2/A1), the smaller need be the RF/RS ratio. Typically, the range of RF/RS ratios may be from about 5 to 15.

Figure 8:
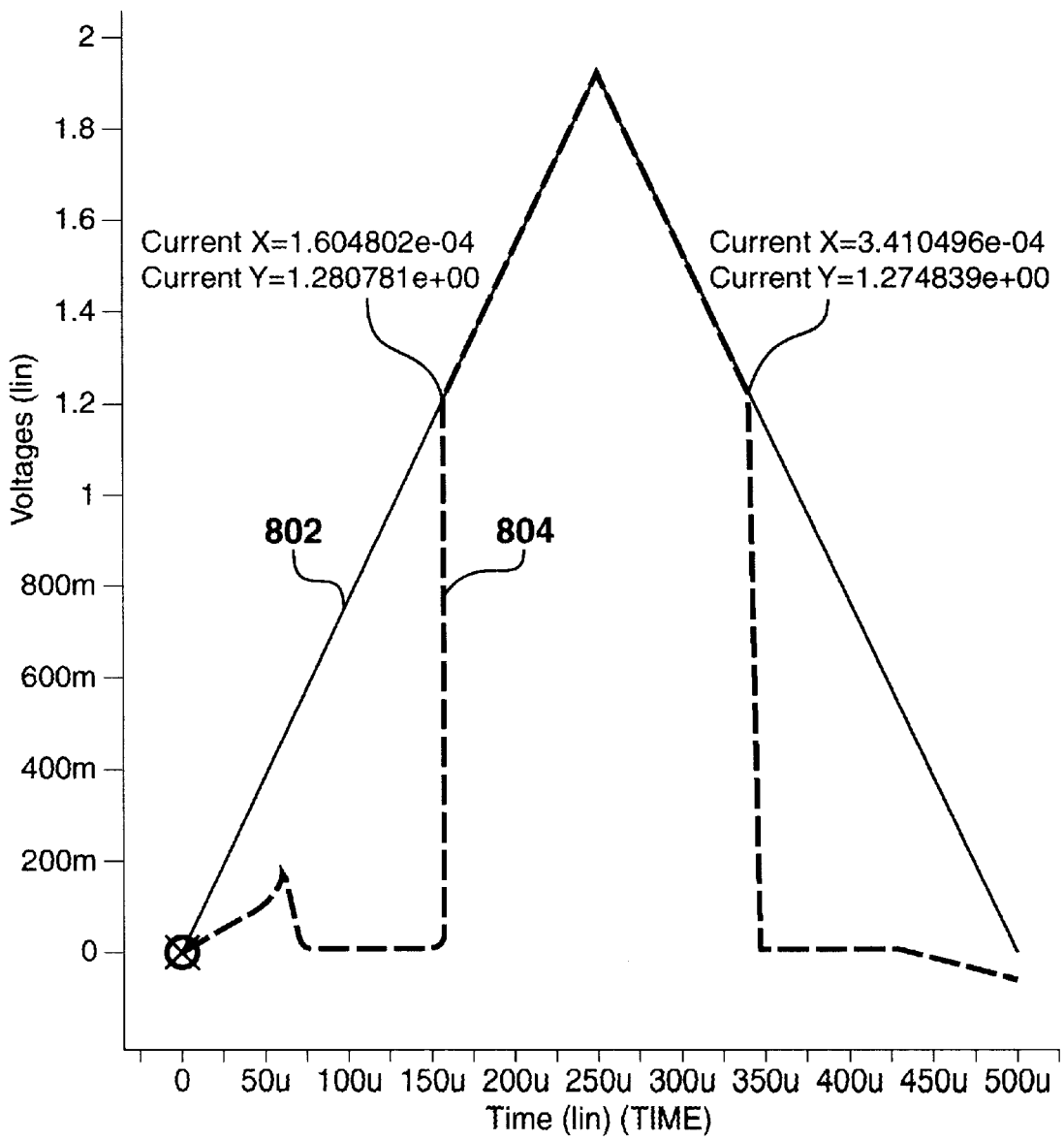
FIG. 8 is a graph of a simulated operation of the bandgap comparator, according to the present invention.

Referring now to FIG. 8, a graph of a simulated operation of the bandgap comparator is illustrated. Plot line 802 represents the voltage VP of the bandgap comparator 212 (FIGS. 2 and 4), and plot line 804 represents the output voltage of the bandgap comparator 212 (BGC_OUT). As the voltage VP rises above the $V_{TP}$ of the bandgap comparator 212, the BGC_OUT of the comparator 212 switches from a logic low (ground or "AGND") to a logic high (VP). As voltage VP falls below the $V_{TP}$ of the bandgap comparator 212, the BGC_OUT of the comparator 212 switches from a logic high to a logic low.

Figure 9:
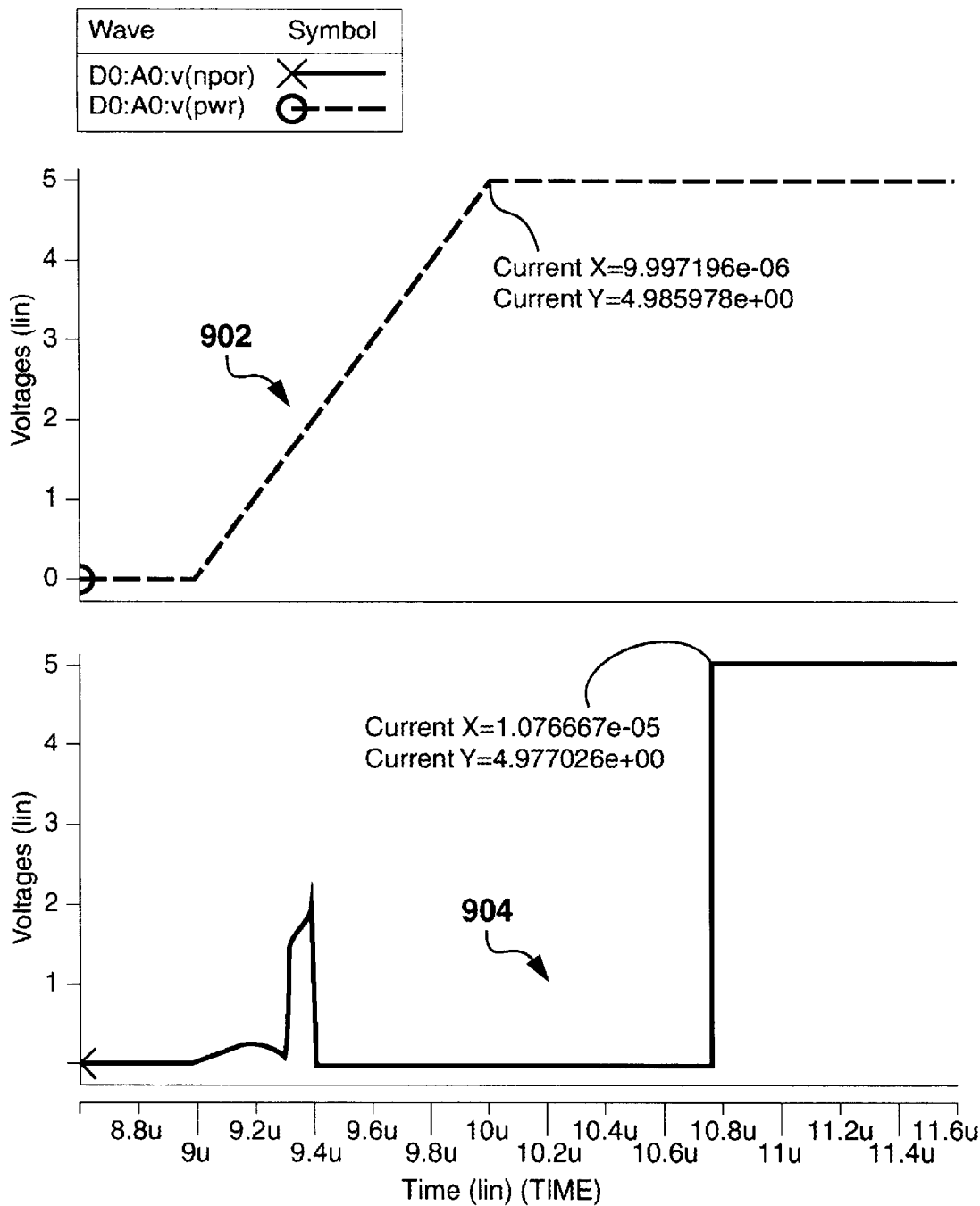
FIG. 9 is a graph of a simulated operation of the delayed power-on-reset of an embodiment of the invention.

Referring to FIG. 9, a graph of a simulated operation of the delayed power-on-reset is illustrated. Plot line 902 represents the voltage at the node 202 (PWR) and plot line 904 represents the voltage at the bandgap output signal node 206 (NPOR). The graph of FIG. 9 demonstrates a delay time of approximately 1 microsecond. This delay time is determined by the time constant of the retriggerable monostable one-shot delay 216 (REDTRIG_OSD). This time constant is determined by the combination of resistor R601 and capacitor 602 (FIG. 6).

Figure 10:
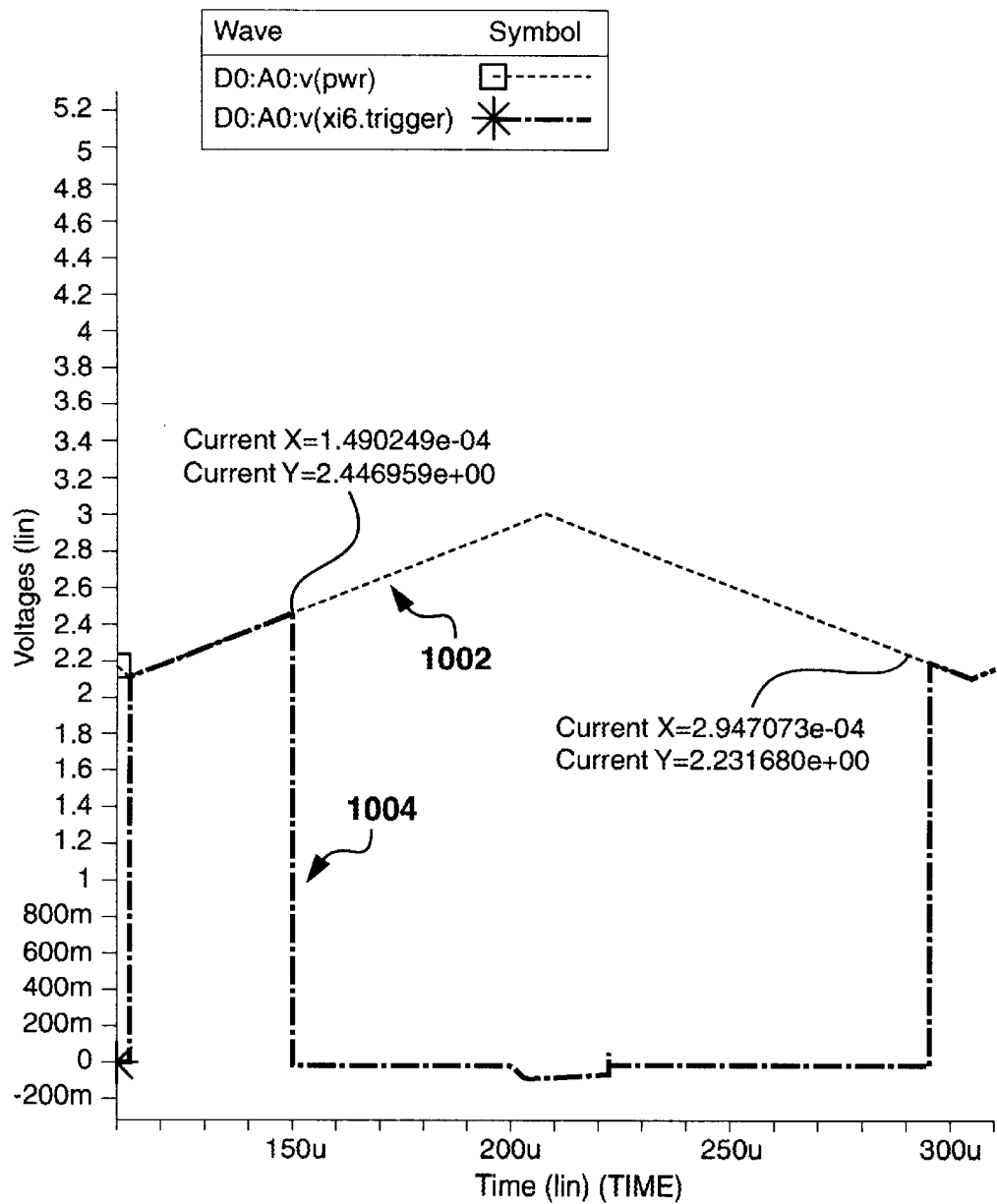
FIG. 10 is a graph of the positive and negative slope trip points showing hysterisis of the bandgap comparator of FIG. 4.

Referring to FIG. 10, a graph of the positive and negative slope trip points illustrates hysterisis of the bandgap comparator having a $V_{TP}$ of approximately 2.3 volts. Plot line 1002 represents the voltage at the node 202 (PWR) and plot line 1004 represents the voltage at the inverting output of the buffer 214 (OUT) of FIGS. 2 and 5. The bandgap comparator of the present invention may be programmed to have a voltage trip point, $V_{TP}$, of about 2.3 volts by using a resistor programming feature more fully illustrated in FIG. 3, and described in more detail in an example hereinbelow.

Figure 11:
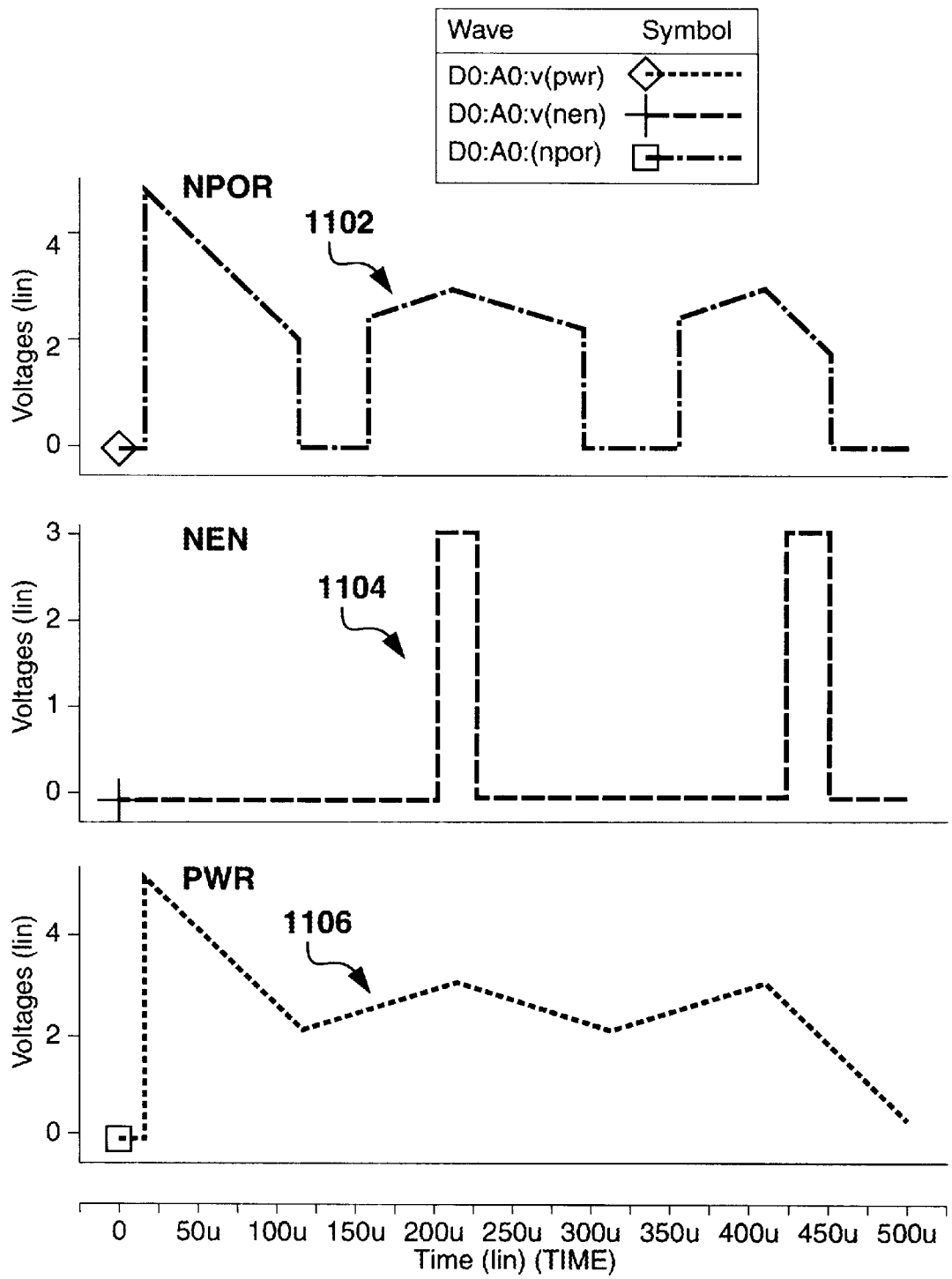
FIG. 11 is a graph of a system level operational simulation of the bandgap comparator low voltage detection system of FIG. 2.

Referring to FIG. 11, a graph of a system level operational simulation of the bandgap comparator low voltage detection system 200 of FIG. 2 is illustrated. Plot line 1102 represents the voltage level at the output signal node 206 (NPOR). Plot line 1104 represents the voltage level at the enable/disable input node 204 (NPOR). Plot line 1106 represents the voltage level at the node 202 (PWR). The graph of FIG. 11 demonstrates the system level operation of the present invention, including the NEN input 204 which is used to power down the bandgap comparator low voltage detection system 200. When powered down, the bandgap comparator low voltage detection system 200 does not detect whether the voltage, VP, is above or below the desired comparison voltage, but when the bandgap comparator low voltage detection system 200 is enabled by the NEN input 204 being switched to ground (logic low) the bandgap comparator low voltage detection system 200 will detect whether VP is above or below the desired comparison voltage, $V_{TP}$. As long as NEN is switched to ground (enabled), NPOR will switch to a logic low state (when VP is less than $V_{TP}$) with substantially no delay, and will switch to a logic high state (when VP is greater than $V_{TP}$) with only a delay intentionally introduced by the one-shot delay 216 described hereinabove.

Referring back to FIGS. 3 and 4, an example application of the design of the bandgap comparator is as follows. The bandgap comparator will be designed for a $V_{TP}$ of approximately 2.3 volts. Preferably, the design will be low current increase operating time when powered from a battery or other limited capacity power supply. Let the operating currents for I1, I2, I3 and I4 be about 0.2 μA, and from equation 3 let C=3.56828, N=0.994657 and $V_{go}$=1.16056:

(3a)

$$I_s = 3.56828 \times Tk^{\wedge}(0.994657) \times EXP^{\wedge} - (1.16056/V_{tk})$$

Equation 3a will now be used to set the resistor ratios in FIG. 3 so that the bandgap comparator of FIG. 4 has a $V_{TP}$ of approximately 2.3 volts. R303 is equivalent to RS of FIG. 4A. For a rising VP, the upper level trip point is calculated using equation 14.

(14)

$$RF = R305 + (R302 \times R304)/(R302 + R304)$$

since the voltage from node RESC (FIG. 4) to ground is $V_{go}$, $V_{TP}$ will be:

$$V_{go} + 0.8\ \mu A \times 11 \times R302.$$

Allow ten times more current to pass through R304 than R305. This is done to minimize the loading effects that the PNP transistors may have on $V_{TP}$ temperature variations.

Let VTP=2.3v, then (15)

$$R302 = (V_{TP} - V_{go})/(0.8\ \mu A \times 11) = 125\ \text{kilohms}.$$

R304 can now be calculated as follows:

(16)

$$R304\ 32\ V_{go}/(0.8\ \mu A \times 10) = 150\ \text{kilohms}.$$

From equation 12, the RF/RS resistor ratio using the above values per the Microchip 120k process at 25 degrees C., preferably should equal 5.384 for best temperature performance. In calculating R303, operating current and temperature should be considered as follows:

(17)

$$R303 = V_{tk} \times \ln(A2/A1)/(0.2\ \mu A) = 86.8\ \mu V \times \ln(8)/(0.2\ \mu A) = 268.3\ \text{kilohms}.$$

(18)

$$RF = 5.384 \times 268.3\ \text{kilohms} = 1444.5\ \text{kilohms}$$

(19)

$$R305 = RF - (R302 \times R304)/(R302 + R304) = 1376.3\ \text{kilohms}.$$

(20)

R306 is approximately equal to % $V_{TP}$ hysteresis desired×(R302+R304).

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A bandgap voltage comparator, comprising:
   first and second transistors forming a first current mirror, wherein the second transistor is diode connected;
   third and fourth transistors forming a second current mirror, wherein the third transistor is diode connected;
   each of the first, second, third and fourth transistors comprising an emitter, base and collector;
   a first resistor having a first and a second end, wherein the first end is connected to the base and the collector of the second transistor, and to the base of the first transistor;
   the first resistor second end is connected to a first voltage node;
   a second resistor having a first and a second end, wherein the first end is connected to the base and collector of the third transistor, and to the base of the fourth transistor;
   the second resistor second end is connected to the first resistor first end; and the first, second, third and fourth transistor emitters are connected to a second voltage node.

2. The bandgap voltage comparator of claim 1, wherein the first and second transistors have substantially the same emitter areas.

3. The bandgap voltage comparator of claim 1, wherein the third and fourth transistors have substantially the same emitter areas.

4. The bandgap voltage comparator of claim 1, wherein the third and fourth transistors have emitter areas from about four to forty-eight times the emitter areas of the first and second transistors.

5. The bandgap voltage comparator of claim 4, wherein the third and fourth transistor emitter areas are an integer multiple of the first and second transistor emitter areas.

6. The bandgap voltage comparator of claim 1, wherein the resistance of the first resistor is from about five to fifteen times the resistance of the second resistor.

7. The bandgap voltage comparator of claim 1, wherein the first voltage node is a common voltage node and the second voltage node is a positive voltage node referenced to the common voltage node.

8. The bandgap voltage comparator of claim 7, wherein a voltage value between the common voltage node and the positive voltage node is from about 0.6 to 5 volts.

9. The bandgap voltage comparator of claim 1, wherein the first, second, third and fourth transistors are PNP junction transistors.

10. The bandgap voltage comparator of claim 1, wherein the first, second, third and fourth transistors are NPN junction transistors.

11. The bandgap voltage comparator of claim 1, wherein the first, second, third and fourth transistors, and the first and second resistors are fabricated on an integrated circuit die.

12. The bandgap voltage comparator of claim 1, wherein a voltage trip point, $V_{TP}$, is determined by a bandgap voltage, $V_{tk}$, of the second and third transistors when the currents through the second and third transistors are equal.

13. The bandgap voltage comparator of claim 12, wherein the voltage trip point, $V_{TP}$, as a function of temperature, $T_k$, is determined by the equation:

$$V_{TP}(T_k)=(k/q \times T_k) \times \{2 \times RF/RS \times \ln(A2/A1 + \ln((k/q \times T_k) \times \ln(A2/A1)RS) - \ln(C \times T_k^N)\} + V_{go};$$

where $V_{TP}$ is the voltage trip point in volts, $k/q=86.7$ $\mu V/(\deg. K)$, $T_k$ is degrees absolute temperature Kelvin, RF is the resistance value of the first resistor, RS is the resistance value of the second resistor, A2 is the emitter area of the third transistor, A1 is the emitter area of the second transistor; and C, N and $V_{go}$ are semiconductor process dependent constants.

14. The bandgap voltage comparator of claim 13, wherein C=3.56828, N=0.994657, and $V_{go}$=1.16056.

15. The bandgap voltage comparator of claim 14, wherein RF/RS is approximately equal to 5.384.

16. A bandgap comparator low voltage detection system, comprising:

a bandgap comparator comprising first and second transistors forming a first current mirror, and third and fourth transistors forming a second current mirror, wherein the second and third transistors are diode connected;

a resistor programming block comprising a plurality of resistors adapted to be configured into a first resistor having a resistance of RF and a second resistor having a resistance of RS, wherein the first resistor is connected to a base and collector of the second transistor and to a base of the first transistor, and the second resistor is connected to a base and collector of the third transistor and to a base of the fourth transistor; and a bandgap comparator trip voltage detection circuit comprising a detection output and inputs for detecting a first current of the first current mirror and a second current of the second current mirror, wherein the detection output is at a first logic level when the second current is greater than the first current and is at a second logic level when the second current is less than the first current, whereby the first logic level indicates an operating voltage being above a desired voltage value and the second logic level indicates the operating voltage being below the desired voltage value.

17. The bandgap comparator low voltage detection system of claim 16, further comprising a retriggerable monostable one-shot delay circuit connected to the detection output, wherein a desired time delay is introduced when the detection output goes from the second logic level to the first logic level.

18. The bandgap comparator low voltage detection system of claim 17, further comprising an inverting buffer circuit connected between the detection output of the bandgap comparator trip voltage detection circuit and the retriggerable monostable one-shot delay circuit.

19. The bandgap comparator low voltage detection system of claim 18, further comprising a Schmitt trigger and an output enable circuit, wherein the output enable circuit disconnects voltage to the bandgap comparator low voltage detection system to conserve power thereto.

20. The bandgap comparator low voltage detection system of claim 19, wherein the bandgap comparator low voltage detection system is fabricated on an integrated circuit die and is adapted for controlling operation of digital logic circuits also fabricated on the integrated circuit die.

21. The bandgap comparator low voltage detection system of claim 20, wherein the digital logic circuits are selected from the group consisting of microcontrollers, microprocessors, digital signal processing logic, application specific integrated circuits, programmable logic arrays, and keyless and wireless entry circuits.

* * * * *